(12) United States Patent
Hsue et al.

(10) Patent No.: US 6,313,006 B1
(45) Date of Patent: Nov. 6, 2001

(54) METHOD OF FIELD IMPLANTATION

(75) Inventors: C. C. Hsue; Sun-Chieh Chien, both of Hsinchu (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 09/048,637

(22) Filed: Mar. 26, 1998

(30) Foreign Application Priority Data

Jan. 9, 1998 (JP) ..................................................... 87100223

(51) Int. Cl.[7] ..................................................... H01L 21/76
(52) U.S. Cl. ........................ 438/407; 438/421; 438/440; 438/449
(58) Field of Search .................................. 438/407, 421, 438/440, 449

(56) References Cited

U.S. PATENT DOCUMENTS

| 4,437,225 | * | 3/1984 | Mizutani . |
| 4,786,614 | * | 11/1988 | Cogan . |
| 4,912,062 | * | 3/1990 | Verma . |
| 4,959,325 | * | 9/1990 | Lee et al. . |
| 5,885,886 | * | 3/1999 | Lee . |
| 5,895,252 | * | 4/1999 | Lur et al. . |
| 5,940,715 | * | 8/1999 | Hayashi . |
| 5,986,314 | * | 11/1999 | Seshadri et al. . |

* cited by examiner

Primary Examiner—John F. Niebling
Assistant Examiner—Josetta I. Jones

(57) ABSTRACT

A method of field implantation. Using a photo-resist layer as a mask, a substrate is implanted with ions to forming a selectively distributed ion field.

10 Claims, 3 Drawing Sheets

METHOD OF FIELD IMPLANTATION

CROSS-REFERENCE TO RELATED APPLICATION

This application claims priority benefit of Taiwan application Serial No. 87100223, filed Jan., 9, 1998, the full disclosure of which is incorporated herein by reference.

BACKGROUND OF THE INVENTION

1. Field of the Invention

The invention relates to a method of ion implantation, and more particularly to a method of field implantation in a dynamic random access memory (DRAM). The predetermined source/drain region of a subsequently formed transistor is covered and implanted with high concentration ions. An ion field is formed, so that in the transistor, no ion field is formed underneath the source/drain region. In addition to the function of device isolation, the ion field effectively reduces the junction capacitance and leakage current. Moreover, the sensitivity of data access is enhanced.

2. Description of the Related Art

In FIG. 1, a conventional method of field implantation is shown. On a substrate 10, for example, a P-type substrate, a field oxide layer 30 is formed. According to a required depth, P-type ions are implanted to the substrate 10. A P-type ion field to increase the doping concentration under the channel, or as a device isolation, or a P-field, is formed by the P-type ions 20a in the substrate 10. Similarly, if an N-type substrate is in use, N-type ions are implanted to form an N-type ion field (N-field).

In FIG. 2, a DRAM formed by using the substrate is shown in FIG. 1. The method of forming the DRAM is not described here for it is a well-know technique. The disadvantages of the method are as follows.

1. The junction gradient between the connecting point 210 and the substrate 10 is too high, so that the leakage current is increased.

2. In the area of the bit line connecting point, the very high junction gradient causes a larger junction capacitance between the bit line and the substrate.

3. As the junction capacitance between the bit line and the substrate increases, the ratio of Cb/Cs is increased to lower the sensitivity of data access.

SUMMARY OF THE INVENTION

It is therefore an object of the invention to provide a method of field implantation. The junction gradient between the substrate and the bit line is decreased, so that the leakage current and the junction capacitance are increased, and the sensitivity of data access is increased.

To achieve these objects and advantages, and in accordance with the purpose of the invention, as embodied and broadly described herein, the invention is directed towards a method of field implantation. On a semiconductor substrate, a field oxide layer is formed. A photo-resist layer is formed and patterned on substrate as a mask for the subsequent ion implantation. A first type ion is implanted into a predetermined depth of the substrate. The photo-resist layer is removed.

It is to be understood that both the foregoing general description and the following detailed description are exemplary and explanatory only and are not restrictive of the invention, as claimed.

DESCRIPTION OF THE PREFERRED EMBODIMENTS

Figure 1:
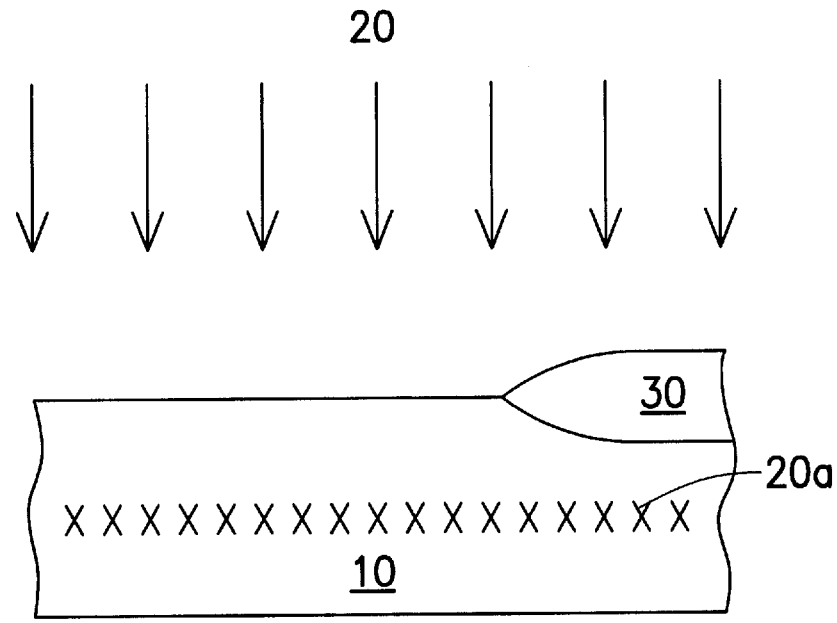
FIG. 1 shows a conventional method of field implantation.
Figure 2:
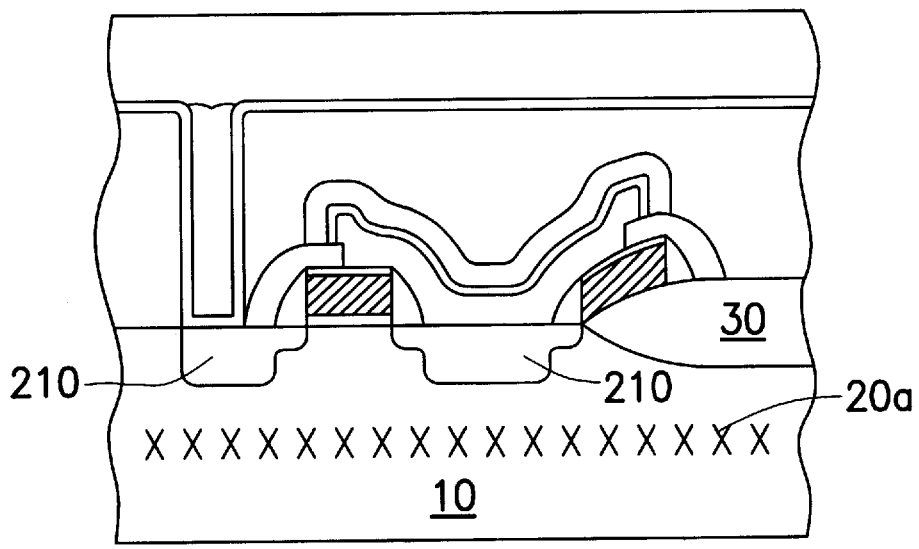
FIG. 2 shows DRAM formed by a conventional method on the substrate shown in FIG. 1.
Figure 3:
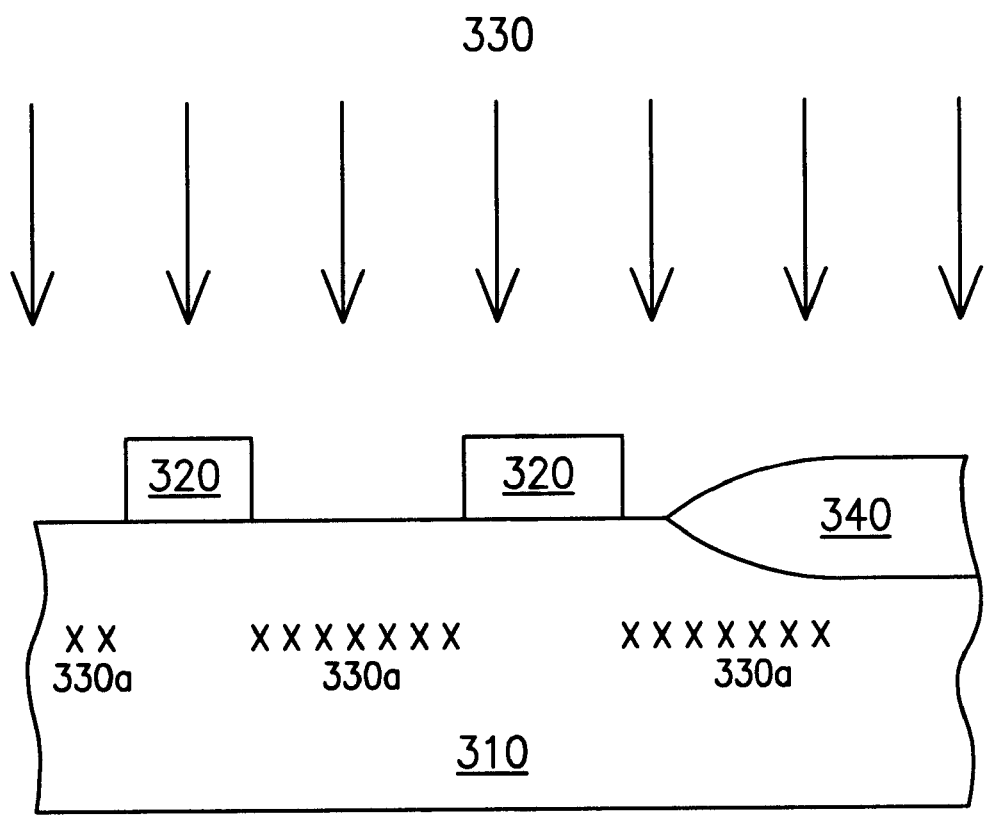
FIG. 3 shows a method of field implantation in a preferred embodiment according to the invention.

In FIG. 3A, a method of field implantation is shown. It is to be noted that the method of forming an ion field provided in the invention can be applied in any type of the substrate. That is, the implanted ions are selected according to the type of the substrate. According to the invention, if a P-type substrate is used, P-type ions are implanted to form a selectively distributed P-field. On the contrary, if an N-type substrate is used, N-type ions are implanted to form a selectively distributed N-field.

Referring to FIG. 3A, on a P-type substrate 310, a device isolation device 340, for example, a field oxide layer 340 by local oxidation (LOCOS) or a shallow trench isolation (STI), to define a device region. A photo-resist layer is formed on the substrate 310. Using photolithography and etching, the photo-resist layer is patterned as the photo-resist a layer 320 shown in the figure. Using the photo-resist layer 320 as a mask, a predetermined source/drain region of a DRAM formed subsequently is covered. P-type ions 330 are implanted into a predetermined depth in the exposed substrate 310 to form a selectively distributed P-type ion field (P-field) 330a for device isolation. A transistor, a capacitor and a plug are formed to fabricate a DRAM cell on the substrate 310 by a conventional method. It is to be noted that after the formation of the DRAM cell, the ion field 330a is not located underneath the source/drain region. The junction leakage between the source/drain region and the substrate is greatly reduced. The junction capacitance between the bit line and the substrate is effectively reduced. The ratio of Cb/Cs is reduced, the sensitivity of data access is enhanced.

In the conventional method, the ion field is formed all over the substrate. On the contrary, the ion field is selectively distributed in the substrate to avoid the formation of ion field underneath the source/drain region. The selective distribution of the ion field is therefore a very important characteristic of the invention.

Figure 4A:
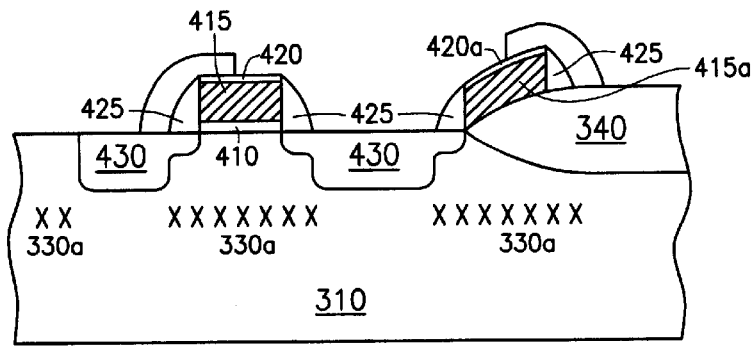
FIG. 4A to FIG. 4C are cross sectional views of a DRAM formed on the substrate shown in FIG. 3.

Referring to FIG. 4A, the photo-resist layer 320 is removed. A DRAM cell is formed on the substrate 310. In the early stage of fabricating a device, the process comprises various steps ion implantation, such as field implantation and anti-punch implantation to form a P- or N-type metal-oxide semiconductor (MOS), or a P- or N-well in a complementary MOS (CMOS).

The fabricating process of a DRAM on the substrate 3 10 is described in detail as follows. After the formation of the ion field 330a, on the device region of the substrate 310, a gate oxide having a thickness of about 30 Å to 200 Å is formed under an oxygen environment at about 800° C. to 1000° C. A doped first poly-silicon layer having a thickness of about 1000 Å to 2500 Å is formed on the gate oxide layer 310. Normally, a metal layer, or a metal silicide layer (not shown), for example, a tungsten silicide or a titanium silicide, is formed on the first poly-silicon layer.

A dielectric layer is formed on the first poly-silicon layer to avoid damage during the subsequent etching process of forming a contact window. Using conventional photolithography, the gate oxide layer 210, the first poly-silicon layer, the metal or the metal silicide layer and the first dielectric layer are patterned to form a gate 415 and a conductive wiring 415a and the dielectric layer 420 and 420a. Using the gate 415 and the conductive wiring 415a as a mask, the exposed substrate 310 is lightly doped with N-type ions to form a lightly doped source/drain region. A spacer 425 is formed on the side walls of the gate 415 and the conductive wiring 415a. Using the gate 415, the conductive wiring 415, and the spacer as a mask, the exposed substrate 310 is heavily doped with N-type ions to form a source/drain region 430.

Figure 4B:
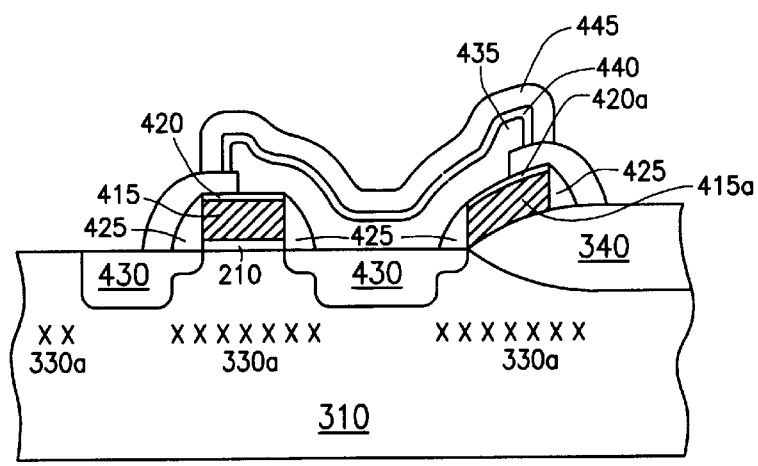

Referring to FIG. 4B, a doped poly-silicon layer is formed and patterned on the substrate 310 as a bottom electrode 435. On the bottom electrode 435, a dielectric layer 445, for example, an oxide/nitride/oxide (ONO) layer having a thickness of about 1000 Å to 2500 Å formed by low pressure chemical vapor deposition (LPCVD), or a tantalum oxide layer, is formed. A top electrode 445, for example, a doped poly-silicon layer having a thickness of about 1500 Å to 2500 Å formed by CVD, is then formed and patterned on the dielectric layer 445.

Figure 4C:
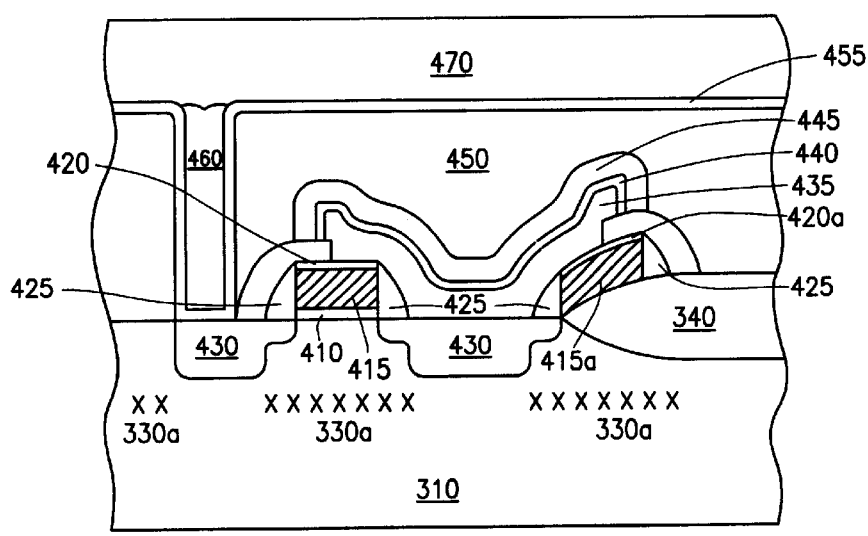

Referring to FIG. 4C, a dielectric layer 450 is formed and patterned over the substrate 310 to form a contact window, so that the source/drain region is exposed. A conformal barrier layer 455, for example, a titanium/titanium nitride (Ti/TiN) layer or a titanium tungsten (TiW) layer, is formed over the substrate 310. The contact window is filled a conductive layer. The conductive layer is etched back to form a plug 460 as an interconnect.

The invention has the following advantages:

1. The junction gradient between the connecting point and the substrate is effectively reduced.

2. The leakage current between the connecting point and the substrate is greatly reduced.

3. The junction capacitance between the bit line and the substrate is reduced.

4. The total capacitance of the bit line is increased. The ratio of Cb/Cs is increased, so that the sensitivity of data is enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of field implantation, wherein a first type substrate comprising a device isolation structure and a device region defined by the device isolation structure is provided, comprising:

forming and patterned a photo-resist layer on the device region;

implanting a first type ion into a predetermined depth of the first type substrate by using the photo-resist layer as a mask, so that a first type ion field is selectively formed in the first type substrate, and the predetermined source/drain region of a subsequently formed dynamic random access memory does not have the ion field formed underneath;

removing the photo-resist layer; and forming the dynamic random access memory on the device region, wherein the dynamic random access memory comprising a transistor formed of a gate and the source/drain region, and a capacitor.

2. The method according to claim 1, wherein the first type ion includes an N-type type ion.

3. The method according to claim 1, wherein the first type ion includes a P-type ion.

4. A method of field implantation, wherein a first type substrate, having a source/drain region and a gate electrode of a MOS device, is provided, the method comprising:

forming a photo-resist layer to expose a portion of the substrate;

selectively forming a first type ion field in the substrate with the photo-resist layer as a mask, the ion field being located in a predetermined position such that a junction gradient between the substrate and a bit line subsequently formed is decreased, wherein the ion field located underneath the gate electrode without extending through the source/drain region; and removing the photo-resist layer.

5. The method according to claim 4, comprising further the steps of:

forming a dynamic random access memory comprising a second type MOS transistor in the substrate after the step of removing the photo-resist layer; and forming a bit line of the dynamic random access memory; wherein the ion field is not formed underneath a source/drain region of the second type MOS transistor.

6. The method according to claim 5, wherein the first type is N-type and the second type is P-type.

7. The method according to claim 5, wherein the first type is P-type and the second type is N-type.

8. A method of field implantation, wherein a first type substrate is provided, the method comprising:

forming a photo-resist layer to expose a portion of the substrate;

selectively forming a first type ion field in the substrate with the photo-resist layer as a mask, the ion field being located in a predetermined position such that a junction gradient between the substrate and a bit line subsequently formed is decreased;

removing the photo-resist layer;

forming a dynamic random access memory comprising a second type MOS transistor in the substrate after the step of removing the photo-resist layer; and forming a bit line of the dynamic random access memory; wherein the ion field is not formed underneath a source/drain region of the second type MOS transistor.

9. The method according to claim 8, wherein the first type is N-type and the second type is P-type.

10. The method according to claim 8, wherein the first type is P-type and the second type is N-type.

* * * * *